(12) United States Patent
Eun

(10) Patent No.: US 7,153,771 B2
(45) Date of Patent: Dec. 26, 2006

(54) METHOD FOR FORMING METAL CONTACT IN SEMICONDUCTOR DEVICE

(75) Inventor: Byung-Soo Eun, Ichon (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 192 days.

(21) Appl. No.: 10/880,348

(22) Filed: Jun. 30, 2004

(65) Prior Publication Data

US 2005/0130412 A1 Jun. 16, 2005

(30) Foreign Application Priority Data

Dec. 15, 2003 (KR) ...................... 10-2003-0091100

(51) Int. Cl.
*H01L 21/44* (2006.01)
(52) U.S. Cl. .................. 438/671; 438/672; 438/695; 438/637
(58) Field of Classification Search ............... 438/695, 438/637, 671, 672
See application file for complete search history.

(56) References Cited

U.S. PATENT DOCUMENTS 5,562,801 A * 10/1996 Nulty .................... 438/695

6,103,455 A * 8/2000 Huang et al. ............... 430/313

FOREIGN PATENT DOCUMENTS

| KR | 10-2000-0007306 A | 2/2000 |
|----|-------------------|--------|
| KR | 10-2002-0002961 A | 1/2002 |

* cited by examiner

*Primary Examiner*—Douglas Menz
(74) *Attorney, Agent, or Firm*—McDermott Will & Emery LLP

(57) ABSTRACT

A method for forming a metal contact in a semiconductor device includes the steps of: forming a bottom wire connected with a metal wire on a substrate; forming an inter-layer insulation layer on an entire surface of a substrate substructure including the bottom wire and the substrate; forming a metal contact hard mask layer on the inter-layer insulation layer; forming a photosensitive layer pattern defining a contact hole on the metal contact hard mask layer; etching the metal contact hard mask layer by using the photosensitive layer pattern as an etch barrier layer; etching the inter-layer insulation layer with use of the etched metal contact hard mask layer as an etch barrier layer to thereby form the contact hole; and forming a metal contact connected to the substrate within the contact hole.

9 Claims, 4 Drawing Sheets

METHOD FOR FORMING METAL CONTACT IN SEMICONDUCTOR DEVICE

FIELD OF THE INVENTION

The present invention relates to a method for fabricating a semiconductor device; and, more particularly, to a method for forming a contact hole in a semiconductor device.

DESCRIPTION OF RELATED ARTS

Current trends of large-scale integration, minimization and high-speed in memory devices have led to a decrease in a capacitor area. However, a minimum capacitance of a capacitor for driving a semiconductor device should be sufficiently secured even if semiconductor devices are highly integrated and minimized.

Recently, as semiconductor devices have been decreased to an ultra fine size in nanometer level, the height of a capacitor oxide layer has been conversely increased to secure the required capacitance. As a result, a height difference between this capacitor oxide layer and a first metal contact (M1C) is greatly pronounced. Herein, the first metal contact (M1C) is a contact for a first metal wire connected with an upper electrode, a bit line in a peripheral region and a source/drain of a transistor.

FIG. 1 is a cross-sectional view showing a structure of a conventional semiconductor device.

As shown, a first inter-layer insulation layer 12 is first formed on a substrate 11 in which a transistor is formed. Then, a bit line 14 connected to the substrate 11 through a bit line contact 13 is formed, and a second inter-layer insulation layer 15 is formed on the bit line 14. Herein, although a plurality of the bit lines 14 is formed in a cell region and a peripheral region, only the bit line 14 formed in the peripheral region is shown in FIG. 1.

A plurality of storage node contacts 16 passing through the first and the second inter-layer insulation layers 12 and 15 is formed. A plurality of capacitors connected to the substrate 11 through the corresponding storage node contact 16 is formed thereafter. More specifically, the capacitor includes a lower electrode 17, a dielectric layer 18 and an upper electrode 19, and the lower electrode 17 is formed in a cylinder type within an opening of a capacitor oxide layer 20.

Next, a third inter-layer insulation layer 21 is formed on the above resulting structure including the capacitors and is etched to form a contact hole for a first M1C 22A for connecting the upper electrode 19 to a first metal wire 23 formed in a cell region. Meanwhile, the third inter-layer insulation layer 21, the capacitor oxide layer 20 and the second inter-layer insulation layer 15 are etched to form a contact hole for a second M1C 22B for connecting the bit line 14 to another first metal wire 23 formed in the peripheral region.

In the conventional semiconductor device structure as shown above, the height H of the capacitor oxide layer 20 is increased to 25000 Å and thus, a height difference between the capacitor oxide layer 20 and the second M1C 22B connected with the bit line 14 is greater than 35000 Å. As a result of this increased height difference, it is limited to apply a photo-exposure process and an etching process to the second M1C 22B. That is, there exist problems of a defect in opening the contact hole and an increased contact resistance since the contact hole for forming the second M1C is deep.

In case of the photo-exposure process for forming the M1Cs typically in a semiconductor device with the size of 100 nm, an inter-layer insulation layer having a thickness of 33000 Å is etched by using a KrF photo-exposure equipment and a photosensitive layer sensitive to a light source of deep ultra violet (DUV) having a wavelength of 0.86 μm. In this case, the inter-layer insulation layer is etched with use of the photosensitive layer as an etch barrier layer to thereby form the M1Cs.

However, when forming a deep M1C, the above case of using the photosensitive layer as the etch barrier layer is applicable to a 100 nm semiconductor device but is inapplicable to a 80 nm semiconductor device. Furthermore, compared to a 100 nm semiconductor device, a 80 nm semiconductor device needs to be defined with the smaller size of the M1C. Therefore, it is mandated to use a photo-exposure equipment using a light source having a shorter wavelength, e.g., ArF. As a result, it is necessary to use a thinner photosensitive layer and a photosensitive layer having no selectivity when the M1C is formed in a 80 nm semiconductor device.

Even if the required size of the M1C is defined by the KrF light source, it is still necessary to decrease the thickness of the photosensitive layer in order to secure an intended critical dimension (CD) and depth of focus (DOF). Since the thickness of the photosensitive layer is needed to be decreased during an etching process for forming the M1C, it is actually impossible to apply the photosensitive layer as an etch barrier layer during the etching process. Accordingly, it has been vigorously studied on a hard mask development to form a deep M1C.

SUMMARY OF THE INVENTION

It is, therefore, an object of the present invention to provide a method for forming a deep metal contact in a semiconductor device even if the height of a capacitor oxide layer is increased to secure a required capacitance.

In accordance with an aspect of the present invention, there is provided a method for forming a metal contact in a semiconductor device, including the steps of: forming a bottom wire connected with a metal wire on a substrate; forming an inter-layer insulation layer on an entire surface of a substrate substructure including the bottom wire and the substrate; forming a metal contact hard mask layer on the inter-layer insulation layer; forming a photosensitive layer pattern defining a contact hole on the metal contact hard mask layer; etching the metal contact hard mask layer by using the photosensitive layer pattern as an etch barrier layer; etching the inter-layer insulation layer with use of the etched metal contact hard mask layer as an etch barrier layer to thereby form the contact hole; and forming a metal contact connected to the substrate within the contact hole.

In accordance with another aspect of the present invention, there is also provided a method for forming a metal contact in a semiconductor device, including the steps of: forming a bottom wire connected with a metal wire on a substrate; forming an inter-layer insulation layer on an entire surface of a substrate structure including the bottom wire and the substrate; forming a metal contact hard mask layer on the inter-layer insulation layer; forming an anti-reflective coating (ARC) layer on the metal contact hard mask layer; forming a photosensitive layer pattern defining a contact hole on the ARC layer; simultaneously etching the ARC layer and the metal contact hard mask layer by using the photosensitive layer as an etch barrier layer; etching the inter-layer insulation layer with use of the ARC layer and the metal contact hard mask layer as an etch barrier layer to thereby form the contact hole; and forming a metal contact connected to the substrate within the contact hole.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a preferred embodiment of the present invention will be described in detail with reference to the accompanying drawings.

FIGS. 2A to 2F are cross-sectional views illustrating a method for forming a metal contact in a semiconductor device in accordance with a preferred embodiment of the present invention.

Figure 1:
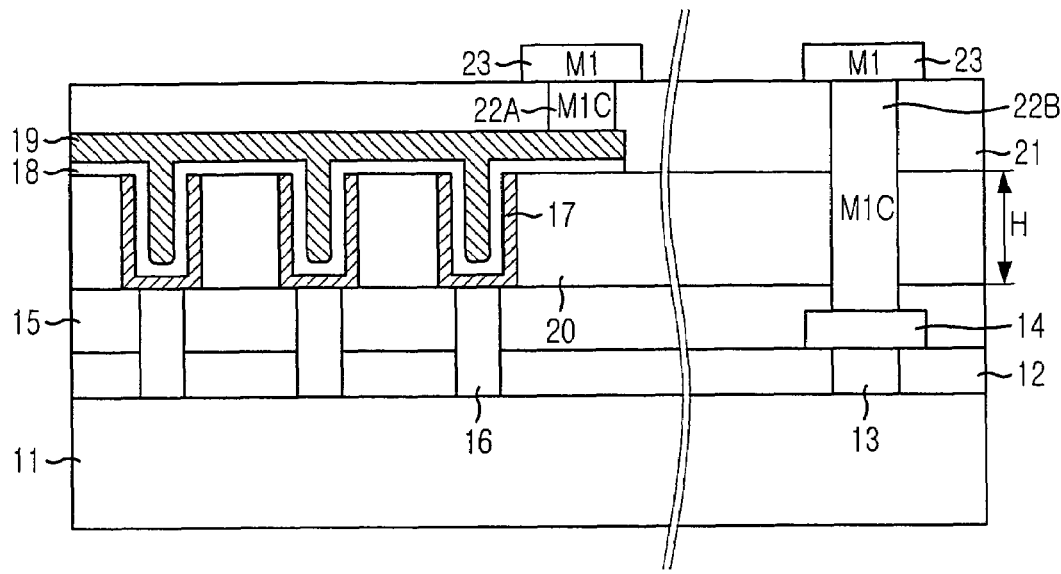
FIG. 1 is a cross-sectional view showing a structure of a conventional semiconductor device.
Figure 2A:
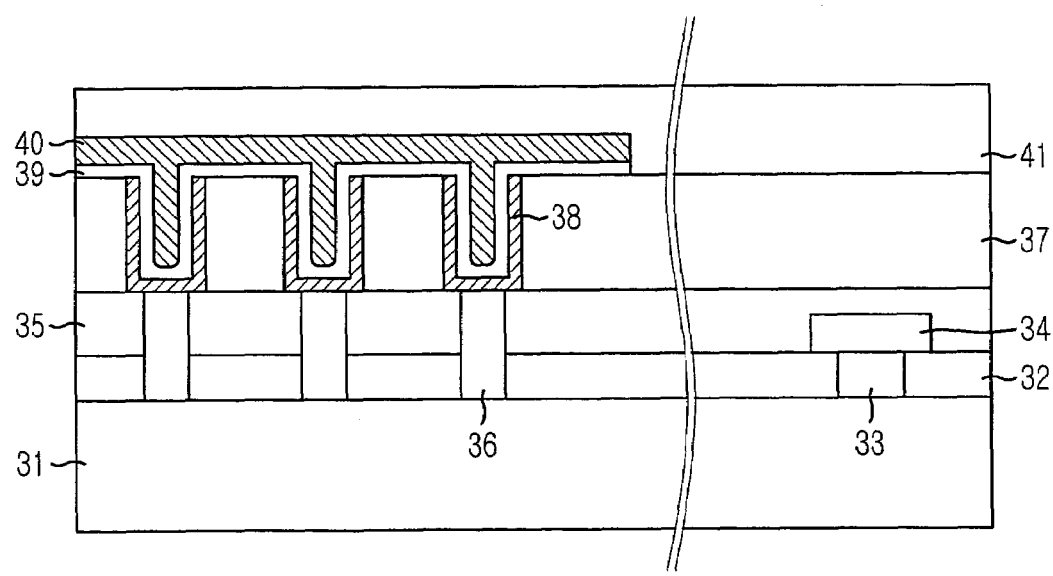
FIGS. 2A to 2F are cross-sectional views illustrating a method for forming a metal contact in a semiconductor device in accordance with a preferred embodiment of the present invention.

Referring to FIG. 2A, a first inter-layer insulation layer 32 is formed on a substrate 31 providing a transistor, and then, a bit line 34 connected to the substrate 31 through a bit line contact 33 is formed. Thereafter, a second inter-layer insulation layer 35 is formed on the bit line 34. Hereinafter, the transistor and the bit line 34 are formed through the known methods. Also, although a plurality of the bit lines 34 is formed in a cell region and a peripheral region, only the bit line 34 formed in the peripheral region is shown in FIGS. 2A to 2F.

Next, the second inter-layer insulation layer 35 and the first inter-layer insulation layer 32 are etched to form a plurality of storage node contact holes each exposing a portion of the substrate 31, typically, a source/drain of the transistor. Then, a material for forming storage node contacts 36 is filled into each storage node contact hole. At this time, the storage node contact 36 is made of polysilicon. A landing plug contact (LPC) can be possibly formed between the storage node contact 36 and the substrate 31.

Subsequent to the formation of the storage node contacts 36, a capacitor oxide layer 37 is formed on the above etched second inter-layer insulation layer 35 and is etched to form openings (not shown) for forming lower electrodes of capacitors. Herein, each opening opens the corresponding storage node contact 36. Thereafter, a conductive layer for forming a lower electrode is deposited on the capacitor oxide layer 37 and into each opening and is subjected to an etch-back process to thereby form lower electrodes 38 in cylinder type within each opening. A dielectric layer 39 is then formed on the above resulting structure including the capacitor oxide layer 37 and the lower electrodes 38. Upper electrodes 40 are formed on the dielectric layer 39.

After formation of the capacitor as the above, a third inter-layer insulation layer 41, which is also called an inter-metal dielectric layer, is deposited on an entire surface of the above resulting structure including the capacitors. Thereafter, a process for forming first metal wires M1 connecting to the upper electrode 40 and the bit line 34 formed in the peripheral region is performed.

Figure 2B:
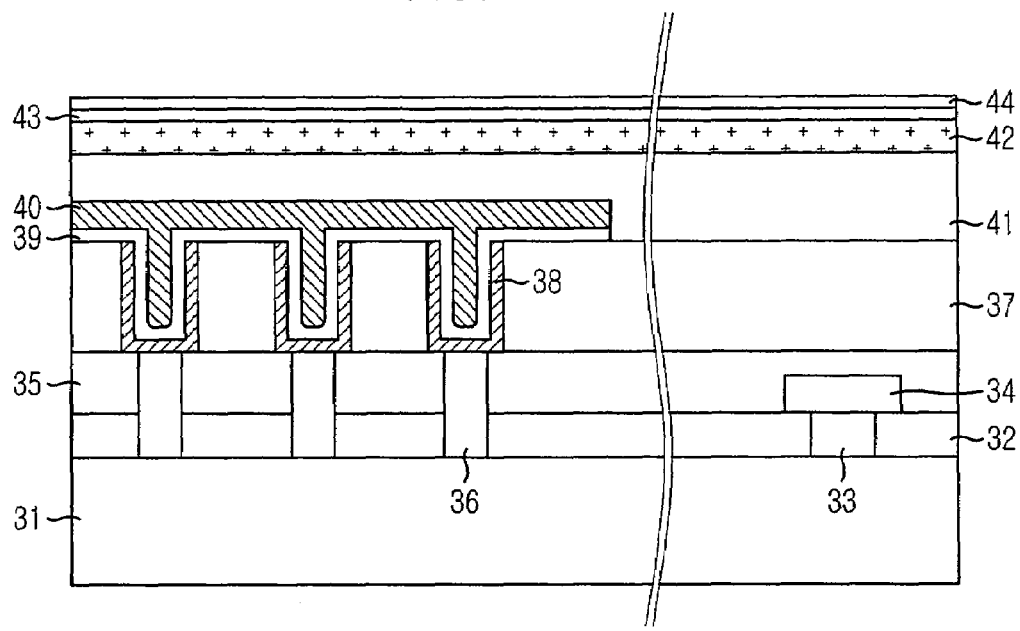

Referring to FIG. 2B, an aluminum (Al) layer 42 for use in a hard mask is formed on the third inter-layer insulation layer 41. At this time, the aluminum layer 42 is deposited in two steps. More specifically, a seed aluminum layer is first formed at a temperature of approximately 400° C. under a power of approximately 12 kW without performing a thermal process. At this time, the seed aluminum layer has a thickness of approximately 1500 Å. Then, the aluminum layer 42 is deposited under a power of approximately 3 kW through a thermal process. At this time, the aluminum layer 42 has a thickness of approximately 1500 Å. Therefore, the total thickness of the finally deposited aluminum layer 42 is approximately 3000 Å.

Herein, unlike the conventional metal wires, a titanium (Ti) layer typically used as a glue layer is not necessarily formed, and thus, the seed aluminum layer can be formed under the high power of approximately 12 kW. Then, the aluminum layer 42 is deposited with a slow rate under a low power accompanied with the thermal process, which allows the aluminum layer 42 to be sufficiently re-flowed, so that the uniform and planarized aluminum layer 42 is formed on an entire surface of the third inter-layer insulation layer 41.

Afterwards, a titanium nitride (TiN) layer 43, which is an anti-reflective coating (ARC) layer for forming a pattern, is deposited on the aluminum layer 42 by using a physical vapor deposition (PVD) technique until reaching a thickness of approximately 200 Å. A silicon oxynitride (SiON) layer 44, which is an ARC layer for use in KrF and DUV, is deposited on the titanium nitride layer 43 until reaching a thickness of approximately 300 Å.

Figure 2C:
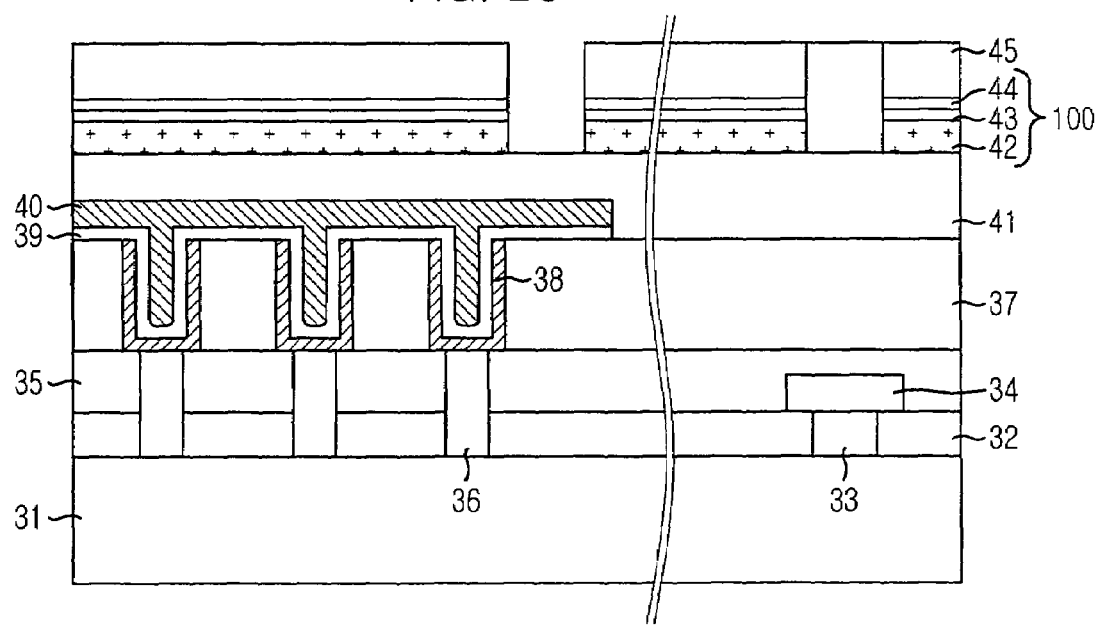

Referring to FIG. 2C, a photosensitive layer is coated on the silicon oxynitride layer 44 and is patterned by a photo-exposure and developing process to thereby form a photosensitive layer pattern 45 defining a first metal contact M1C. At this time, a KrF photo-exposure equipment is used, and the photosensitive layer pattern 45 has a thickness of approximately 0.86 μm.

Next, the silicon oxynitride layer 44, the titanium nitride layer 43 and the aluminum layer 42 are sequentially etched with use of the photosensitive layer pattern 45 as an etch barrier layer. At this time, the silicon oxynitride layer 44 is etched under a pressure of approximately 12 mTorr along with use of etch gases of dichloride ($Cl_2$), argon (Ar) and trifluoromethane ($CHF_3$) supplied in a quantity of approximately 50 sccm, approximately 35 sccm and approximately 15 sccm, respectively. Also, the titanium nitride layer 43 and the aluminum layer 42 are etched under a pressure of approximately 10 mTorr along with use of etch gases of $Cl_2$ and boron trichloride ($BCl_3$) supplied in a quantity of approximately 160 sccm and approximately 80 sccm, respectively. Hereinafter, the above stack structure including the aluminum layer 42, the titanium nitride layer 43 and the silicon oxynitride layer 44 formed by the photosensitive layer pattern 45 is referred to as a M1C hard mask layer 100.

Figure 2D:
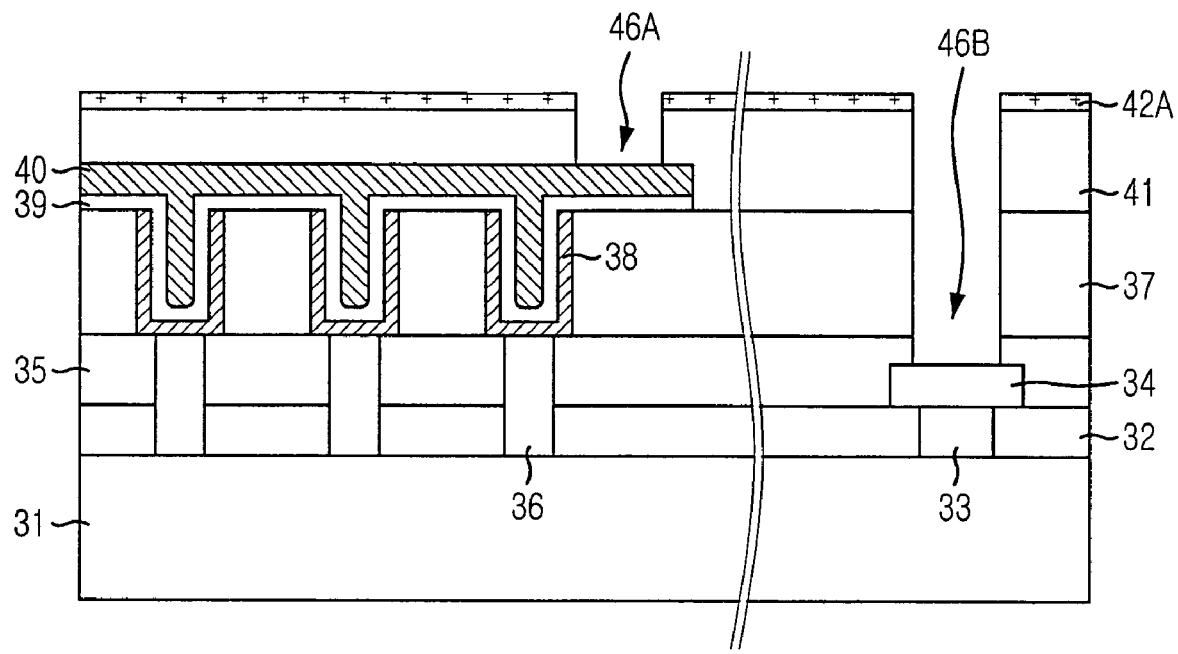

Referring to FIG. 2D, the photosensitive layer pattern 45 is removed, and a first metal contact (M1C) process proceeds by using the M1C hard mask layer 100, more preferably, the aluminum layer 42, as an etch barrier layer.

More specifically, the third inter-layer insulation layer 41 is etched with use of the M1C hard mask layer 100 as the etch barrier layer to form a first contact hole 46A exposing an surface of the upper electrode 40. Herein, the first contact hole 46A is for forming a first M1C connected to the upper electrode 40. Simultaneous to the formation of the first contact hole 46A, the third interlayer insulation layer 41, the capacitor oxide layer 37 and the second inter-layer insulation layer 35 are sequentially etched with use of the M1C hard mask layer 100 as the etch barrier layer to form a second contact hole 46B opening an upper portion of the bit line 34. Herein, the second contact hole 46B is for forming a second M1C connected to the bit line 34. During the formation of the first and the second contact holes 46A and 46B, an over-etching takes place in order to open the upper portion of the bit line 34, thereby inevitably resulting in damages to the M1C hard mask layer 100. As a result, only a partial portion of the aluminum layer 42 remains in a predetermined thickness after the formation of the first and the second contact holes 46A and 46B. Hereinafter, the remaining portion of the aluminum layer 42 is denoted with the reference number 42A.

For the etching process for forming the first and the second contact holes 46A and 46B, such gases as carbon tetrafluoride ($CF_4$), tetracarbon tetrafluoride ($C_4F_4$) and difluoromethane ($CH_2F_2$) used in etching an oxide layer is employed as an etch gas. Since the aluminum layer 42 has a stronger tolerance to the above gases than the photosensitive layer does, it is possible to perform the etching process for forming the deep second contact hole 46B with a greater margin.

Figure 2E:
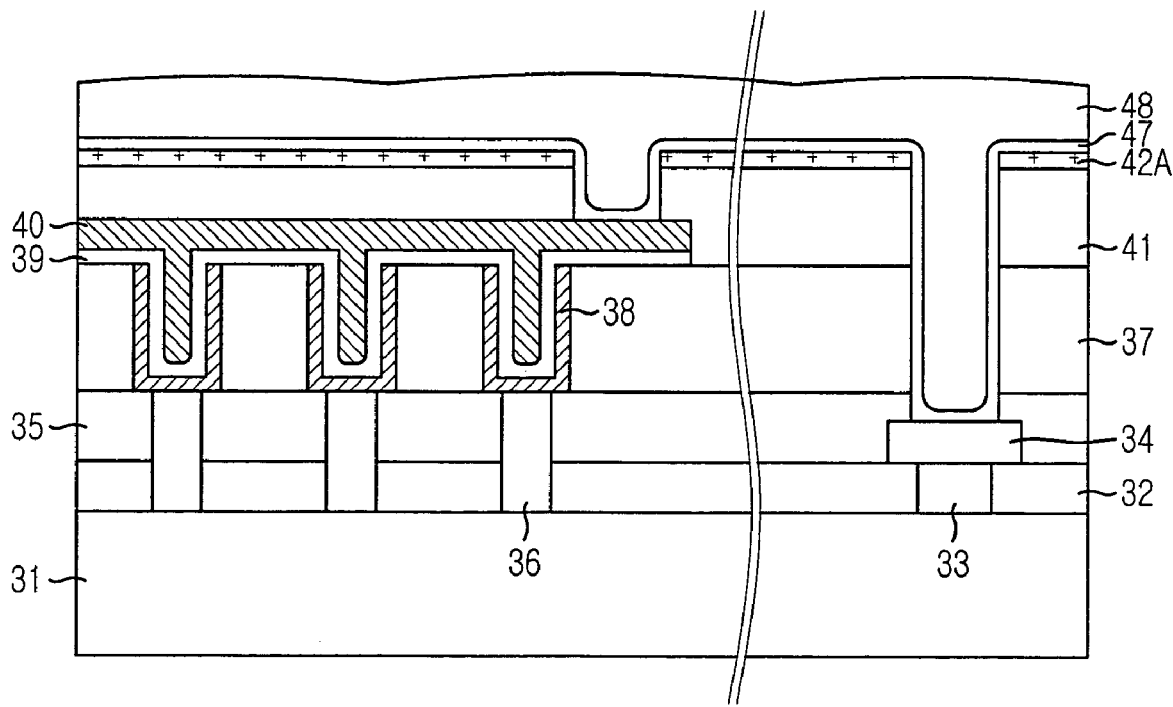

Referring to FIG. 2E, a barrier metal 47 of TiN and Ti serving as a barrier metal layer against the M1Cs is formed on an entire surface of the above structure including the first and the second contact holes 46A and 46B. Hereinafter, the barrier metal 47 of TiN and Ti is referred to as the TiN/Ti barrier metal layer. Then, a tungsten (W) layer 48 is deposited on the TiN/Ti barrier metal layer 47 until sufficiently being filled into the first contact hole 46A and the second contact hole 46B. The TiN/Ti barrier metal layer 47 is formed by sequentially depositing a Ti layer and then a TiN layer. Also, the tungsten layer 48 is deposited through the use of a chemical vapor deposition (CVD) technique.

Figure 2F:
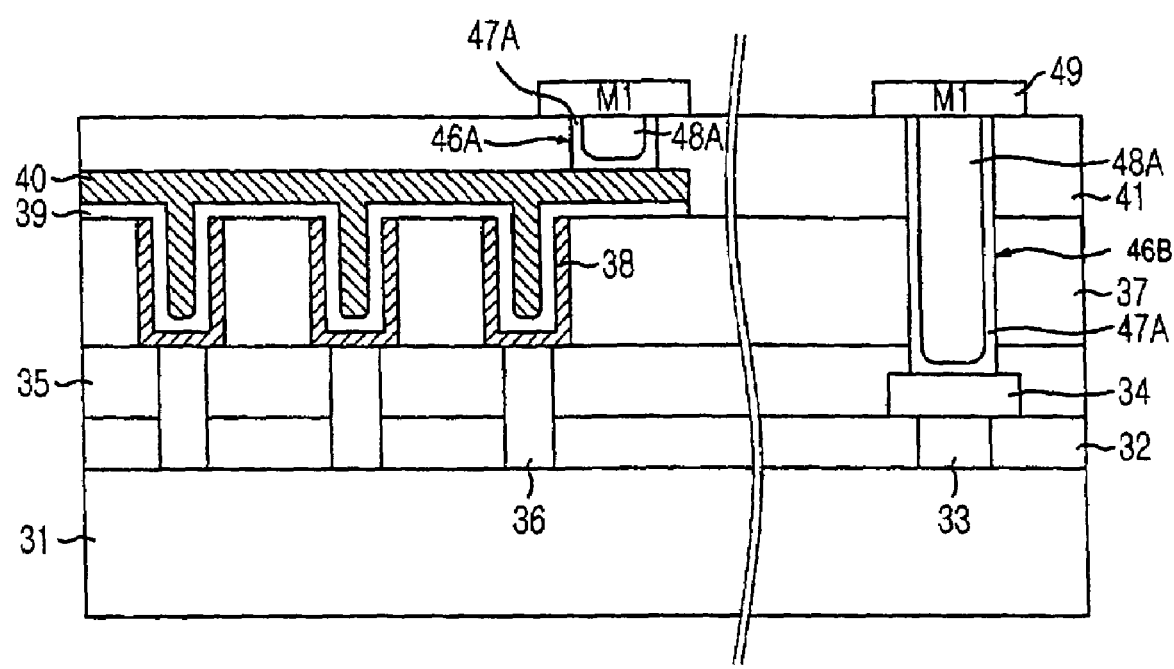

Referring to FIG. 2F, an etch-back process is performed to the tungsten layer 48 to remove a portion of the tungsten layer 48 disposed on the third inter-layer insulation layer 41. From this etch-back process, a plurality of tungsten plugs 48A each filled into the first and the second contact holes 46A and 46B is formed. At this time, the remaining aluminum layer 42A, the TiN/Ti barrier metal layer 47 and the tungsten layer 48 disposed on the third inter-layer insulation layer 41 are removed. Also, the TiN/Ti barrier metal layer 47 filled into the first contact hole 46A and the second contact hole 46B is referred to as the remaining TiN/Ti barrier metal layer and is denoted with the reference number 47A.

In the etch-back process for forming the tungsten plugs 48A, the tungsten layer 48 is etched under a pressure of approximately 8 mTorr along with use of nitrogen ($N_2$) and sulfur hexafluoride ($SF_6$) supplied in a quantity of approximately 10 sccm and approximately 100 sccm, respectively. At this time, the $SF_6$ gas is used as a main etch gas. The etching is stopped at the TiN layer of the TiN/Ti barrier metal layer 47.

After the etch-back process, the TiN/Ti barrier metal layer 47 and the remaining aluminum layer 42A are removed in an in-situ condition under a pressure of approximately 9 mTorr along with use of $Cl_2$ and $BCl_3$ supplied in a quantity of approximately 110 sccm and approximately 10 sccm, respectively. Generally, a chamber for the above etch-back process is designed to be supplied with the etch gases of $SF_6$, $Cl_2$ and $BCl_3$. Thus, when the etch-back process is performed to the tungsten layer 48, the $SF_6$ etch gas having a good etch selectivity to tungsten is first supplied as the main etch gas to remove the tungsten layer 48. Thereafter, the chamber is supplied with the etch gases of $Cl_2$ and $BCl_3$ to remove the TiN/Ti barrier metal layer 47.

One advantage of the present invention is that the remaining aluminum layer 42A can be etched away without a change in the etching chamber and an additional cost since the etch gas used in the etching of the aluminum layer 42 of the M1C hard mask layer 100 is the same as the etch gases of $Cl_2$ and $BCl_3$ used in the removal of the TiN/Ti barrier metal layer 47.

Meanwhile, the tungsten plugs 48A may be damaged in the course of removing the TiN/Ti barrier metal layer 47 and the aluminum layer 42A with use of the etch gases of $Cl_2$ and $BCl_3$. However, since the tungsten layer 48 has a strong tolerance to the etch gases of $Cl_2$ and $BCl_3$, the tungsten plugs 48A are not severely recessed.

After the above etch-back process, the first M1C and the second M1C each including the remaining TiN/Ti barrier metal layer 47A and the tungsten plug 48A are formed within the first and the second contact holes 46A and 46B, respectively. An aluminum layer is deposited on each of the tungsten plugs 48A and is patterned to form a plurality of first metal wires 49.

As described above, the M1C process proceeds by using the aluminum layer having a higher selectivity than the photosensitive layer does as the M1C hard mask layer. Therefore, it is possible to form a deep M1C in a semiconductor device having an ultra fine size in nanometer level, e.g., approximately 80 nm and approximately 60 nm, even with use of a photo-exposure equipment and processes employed in a conventional 100 nm semiconductor device.

The above preferred embodiment exemplifies a case that the M1C is connected to the bit line. However, it is still possible to form a deep M1C connected to a gate electrode of a transistor in a peripheral region and a source/drain of a transistor.

The present application contains subject matter related to Korean patent application No. KR 2003-0091100, filed in the Korean Patent Office on Dec. 15, 2003, the entire contents of which being incorporated herein by reference.

While the present invention has been described with respect to certain preferred embodiments, it will be apparent to those skilled in the art that various changes and modifications may be made without departing from the scope and spirit of the invention as defined in the following claims.

What is claimed is:

1. A method for forming a metal contact in a semiconductor device, comprising the steps of:
   forming a bottom wire connected with a metal wire on a substrate;
   forming an inter-layer insulation layer on an entire surface of a substrate substructure including the bottom wire and the substrate;
   forming a metal contact hard mask layer formed of an aluminum layer on the inter-layer insulation layer;
   forming a photosensitive layer pattern defining a contact hole on the metal contact hard mask layer;
   etching the metal contact hard mask layer by using the photosensitive layer pattern as an etch barrier layer;
   etching the inter-layer insulation layer with use of the etched metal contact hard mask layer as an etch barrier layer to thereby form the contact hole; and
   forming a metal contact connected to the substrate within the contact hole,
   wherein the aluminum layer is deposited in two steps of depositing a seed aluminum layer under a high power and then depositing a second aluminum layer under a low power accompanied with a thermal process.

2. The method as recited in claim 1, wherein the seed aluminum layer is deposited at a temperature of approximately 400° C. under a power of approximately 12 kW until a thickness of the seed aluminum layer is approximately 1500 Å and the second aluminum layer is deposited under a power of approximately 3 kW until a thickness of the second aluminum layer is approximately 1500 Å.

3. The method as recited in claim 1, wherein the step of forming the photosensitive layer pattern proceeds by using a KrF photo-exposure equipment.

4. The method as recited in claim 1, wherein in the step of forming the contact hole, the inter-layer insulation layer is etched by using one of etch gases such as carbon tetrafluoride ($CF_4$), tetracarbon tetrafluoride ($C_4F_4$) and difluoromethane ($CH_2F_2$).

5. A method for forming a metal contact in a semiconductor device, comprising the steps of:
   forming a bottom wire connected with a metal wire on a substrate;
   forming an inter-layer insulation layer on an entire surface of a substrate structure including the bottom wire and the substrate;
   forming a metal contact hard mask layer formed of an aluminum layer on the inter-layer insulation layer;
   forming an anti-reflective coating (ARC) layer on the metal contact hard mask layer;
   forming a photosensitive layer pattern defining a contact hole on the ARC layer;
   simultaneously etching the ARC layer and the metal contact hard mask layer by using the photosensitive layer as an etch barrier layer;
   etching the inter-layer insulation layer with use of the ARC layer and the metal contact hard mask layer as an etch barrier layer to thereby form the contact hole; and
   forming a metal contact connected to the substrate within the contact hole,
   wherein the aluminum layer is deposited in two steps of depositing a seed aluminum layer under a high power and then depositing a second aluminum layer under a low power accompanied with a thermal process.

6. The method as recited in claim 5, wherein the seed aluminum layer is deposited at a temperature of approximately 400° C. under a power of approximately 12 kW until a thickness of the seed aluminum layer is approximately 1500 Å and the second aluminum layer is deposited under a power of approximately 3 kW until a thickness of the aluminum layer is approximately 1500 Å.

7. The method as recited in claim 5, wherein the step of forming the photosensitive layer pattern proceeds by using a KrF photo-exposure equipment.

8. The method as recited in claim 5, wherein in the step of forming the contact hole, the inter-layer insulation layer is etched by using one of etch gases such as $CF_4$, $C_4F_4$ and $CH_2F_2$.

9. The method as recited in claim 5, wherein the ARC layer is formed by sequentially forming a titanium nitride (TiN) layer and a silicon oxynitride (SiON) layer.

* * * * *